(12) United States Patent
Tzou et al.

(10) Patent No.: US 10,254,789 B2
(45) Date of Patent: Apr. 9, 2019

(54) COVER AND ELECTRONIC DEVICE HAVING THE SAME

(71) Applicants: Jyh-Chyang Tzou, Taipei (TW); Yuan-Ping Chu, Taipei (TW); Tsai-Wen Mao, Taipei (TW); Bar-Long Denq, Taipei (TW); Chun-Ping Li, Taipei (TW)

(72) Inventors: Jyh-Chyang Tzou, Taipei (TW); Yuan-Ping Chu, Taipei (TW); Tsai-Wen Mao, Taipei (TW); Bar-Long Denq, Taipei (TW); Chun-Ping Li, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 15/679,171

(22) Filed: Aug. 17, 2017

(65) Prior Publication Data
US 2018/0260000 A1 Sep. 13, 2018

(30) Foreign Application Priority Data
Mar. 8, 2017 (TW) .............................. 106107485 A

(51) Int. Cl.
*G06F 1/16* (2006.01)
*H05K 5/02* (2006.01)
*H05K 5/03* (2006.01)

(52) U.S. Cl.
CPC ......... *G06F 1/1613* (2013.01); *H05K 5/0247* (2013.01); *H05K 5/03* (2013.01)

(58) Field of Classification Search
CPC .. G06F 1/1684; H05K 5/0217; H05K 5/0247; H05K 5/03
See application file for complete search history.

(56) References Cited

U.S. PATENT DOCUMENTS

| 9,888,597 | B2 * | 2/2018 | Tzou | H05K 5/0239 |
| 2003/0227741 | A1 * | 12/2003 | Moore | G06F 1/1616 |
| | | | | 361/679.55 |
| 2007/0091575 | A1 * | 4/2007 | Hussaini | H02J 7/0042 |
| | | | | 361/715 |

(Continued)

FOREIGN PATENT DOCUMENTS

| CN | 2554709 | 6/2003 |
| CN | 2760649 | 2/2006 |

(Continued)

OTHER PUBLICATIONS

"Office Action of Taiwan Counterpart Application," dated Dec. 20, 2017, p. 1-p. 12.

*Primary Examiner* — Adrian S Wilson
(74) *Attorney, Agent, or Firm* — JCIPRNET

(57) ABSTRACT

A cover adapted to an electronic device is provided. An outer side of the electronic device has a connection port. The cover includes a first covering structure and a second covering structure. The first covering structure is disposed on the outer side and has a plurality of first openings. The second covering structure is connected to the first covering structure and has a second opening. The second opening is aligned to the connection port, and the second opening is separated from the first openings. A connector is adapted to be inserted into the connection port through the second opening.

18 Claims, 2 Drawing Sheets

(56) References Cited

U.S. PATENT DOCUMENTS

2008/0032093 A1\* 2/2008 Deng .................. B32B 3/10
                                                            428/137
2014/0133102 A1\* 5/2014 Lu ...................... G06F 1/203
                                                            361/700

FOREIGN PATENT DOCUMENTS

| CN | 202262176 U | \* | 12/2012 |
| TW | M425309 | | 3/2012 |
| TW | 201346498 | | 11/2013 |
| TW | 201418955 | | 5/2014 |
| TW | M512154 | | 11/2015 |

\* cited by examiner

COVER AND ELECTRONIC DEVICE HAVING THE SAME

CROSS-REFERENCE TO RELATED APPLICATION

This application claims the priority benefit of Taiwan application serial no. 106107485, filed on Mar. 8, 2017. The entirety of the above-mentioned patent application is hereby incorporated by reference herein and made a part of this specification.

BACKGROUND OF THE INVENTION

1. Field of the Invention

The invention relates to a cover and an electronic device having the cover and particularly relates to a cover having a plurality of openings and an electronic device having the cover.

2. Description of Related Art

With advances in technology, nowadays, computers have almost become one of human life's necessities. A laptop offers an advantage of being conveniently portable. More and more people use laptops and connect relevant application products to the laptop through all kinds of connection interfaces such as the Universal Serial Bus (USB) Interface or IEEE1394 interface. For example, an external peripheral device that is connected through the USB interface or IEEE1394 interface includes a portable hard disk, a digital camera, a smartphone and other items that are easy to carry.

In the conventional laptops, a connection port is generally disposed on a side of a device body to serve as the connection interface. Nonetheless, the connection port disposed on the side of the device body is visually prominent, leading to an appearance of the side of the machine lacking consistency and continuity.

SUMMARY OF THE INVENTION

The invention is directed to a cover that may prevent the configuration of a connection port from affecting the appearance of an electronic device is provided.

The invention is directed to an electronic device, a cover thereof may prevent the configuration of the connection port from affecting the appearance of the electronic device is provided.

The invention provides a cover adapted to an electronic device. An outer side of the electronic device has at least one connection port. The cover includes a first covering structure and at least one second covering structure. The first covering structure is disposed on the outer side and has a plurality of first openings. The second covering structure is connected to the first covering structure and has a second opening. The second opening is aligned to the connection port, and the second opening is separated from the first openings. A connector is adapted to be inserted into the connection port through the second opening.

The invention provides an electronic device including a main body and a cover. The main body has an outer side, and the outer side has at least one connection port. The cover includes a first covering structure and at least one second covering structure. The first covering structure is disposed on the outer side and has a plurality of first openings. The second covering structure is connected to the first covering structure and has a second opening. The second opening is aligned to the connection port, and the second opening is separated from the first openings. A connector is adapted to be inserted into the connection port through the second opening.

According to an embodiment of the invention, a material of the at least one second covering structure includes an elastic material, and the connector passes through the second opening through elastic deformation of the at least one second covering structure.

According to an embodiment of the invention, the first covering structure and the at least one second covering structure are integrated.

According to an embodiment of the invention, the first covering structure surrounds the second covering structure.

According to an embodiment of the invention, the first covering structure has a greater hardness than the second covering structure.

According to an embodiment of the invention, each of the first openings and the second opening is oval.

According to an embodiment of the invention, a smallest distance between a peripheral of the second opening and a fringe of the second covering structure along a first direction is longer than twice of a smallest distance between the peripheral of the second opening and the fringe of the second covering structure along a second direction.

According to an embodiment of the invention, the second opening is axially symmetrical to a first axis, two second axes tilt and are axially symmetrical to the first axis, a part of the first openings are arranged along the first axis, and another part of the first openings are arranged along the two second axes.

According to an embodiment of the invention, the cover has an arc section at the connection port, and the arc section extends a distance of greater than 2.5 millimeters along an insertion direction of the connection port.

In view of the foregoing, the cover of the invention further includes the first openings in addition to the second opening for exposing the connection port. Accordingly, the appearance of the electronic device is more consistent and continuous due to the distribution of the first openings and the second opening, and the configuration of the connection port may be prevented from affecting the appearance of the electronic device.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
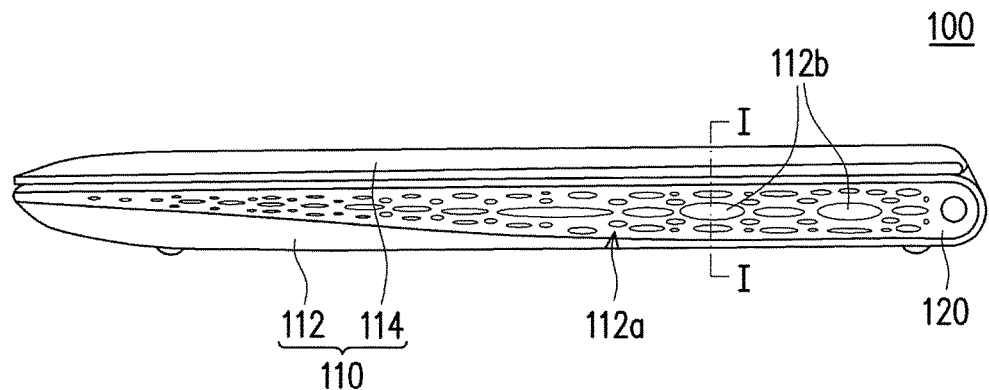
FIG. 1 is a side view of an electronic device according to an embodiment of the invention.

Reference will now be made in detail to the present preferred embodiments of the invention, examples of which are illustrated in the accompanying drawings.

Wherever possible, the same reference numbers are used in the drawings and the description to refer to the same or like parts.

Figure 2:
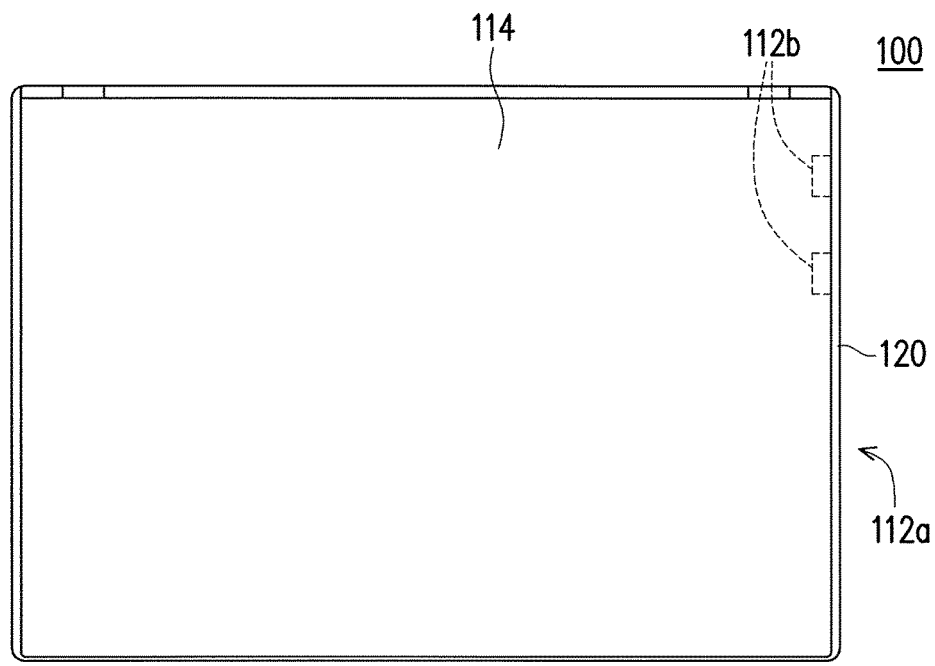
FIG. 2 is a top view of the electronic device of FIG. 1.

FIG. 1 is a side view of an electronic device according to an embodiment of the invention. FIG. 2 is a top view of the electronic device of FIG. 1. Referring to FIGS. 1 and 2, an electronic device 100 of the embodiment includes a main body 110 and a cover 120. The main body 110, such as a laptop, includes a main frame 112 and a display device 114 that are pivoted to each other. The main frame 112 of the main body 110 includes an outer side 112a, and the outer side 112a has at least one connection port 112b (two connection ports are illustrated). The connection port 112b is, for example, a Universal Serial Bus (USB) interface or IEEE1394 interface, but the invention is not limited thereto. The cover 120 is disposed on the outer side 112a of the main body 110 as an appearance piece.

Figure 3:
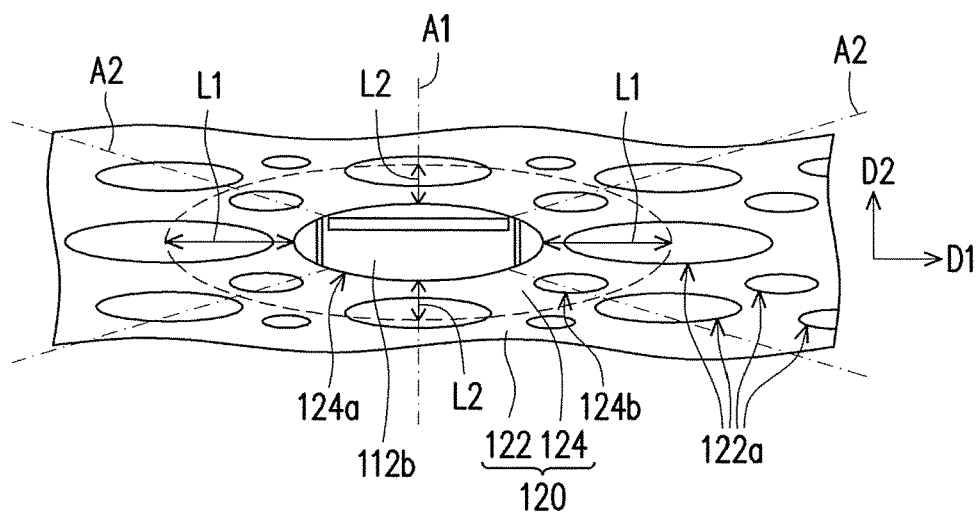
FIG. 3 is a view of partial enlargement of the electronic device of FIG. 1.

FIG. 3 is a view of partial enlargement of the electronic device of FIG. 1. Referring to FIG. 3, the cover 120 includes a first covering structure 122 and at least one second covering structure 124 (one second covering structure is illustrated in FIG. 3). The first covering structure 122 is disposed on the outer side 112a of the main body 110 and has a plurality of first openings 122a. The second covering structure 124 is connected to the first covering structure 122 and has a second opening 124a separated from the first openings 122a, and the first covering structure 122 surrounds the second covering structure 124, for example. The second opening 124a is aligned to the connection port 112b, allowing an external device (such as a portable hard disk, a digital camera, a smartphone and so on) to be inserted into the connection port 112b through a corresponding connector via the second opening 124a.

In the embodiment, a size of the second opening 124a is, for example, smaller than a terminal size of the corresponding connector. Correspondingly, the first covering structure 122 and the second covering structure 124 are, for example, integrated and made of a material such as rubber or other appropriate elastic materials. Consequently, even though the size of the second opening 124a is smaller than the terminal size of the connector, the connector may still pass through the second opening 124a to be inserted into the connection port 112b smoothly through elastic deformation of the second covering structure 124.

Under the configuration, the cover 120 further includes a plurality of the first openings 122a in addition to the second opening 124a exposing the connection port 112b. Therefore, the appearance of the electronic device 100 is more consistent and continuous due to distribution of the first openings 122a and the second opening 124a, and the configuration of the connection port 112b may be prevented from affecting the appearance of the electronic device 100. Besides, when the cover 120 is disposed, since a user may still insert the connector into the connection port 112b smoothly through the second opening 124a, the convenience of using the connection port 112b is not diminished by disposing the cover 120.

As illustrated in FIG. 2, the cover 120 of the embodiment extends to left, right and front sides of the main body 110 of the electronic device 100 and to corners between the left, right and front sides, making the outer side 112a (including the left, right and front sides and the corners between the left, right and front sides, for example) of the main body 110 of the electronic device 100 more visually consistent. Besides, as illustrated in FIG. 3, a part of the first openings 122a extend from the first covering structure 122 to the second covering structure 124 to avoid an overly long distance between the first openings 122a and the second opening 124a. The second covering structure 124 may further include a plurality of third openings 124b surrounding the second opening 124a, and the first openings 122a, the second opening 124a and the third openings 124b are all oval. Therefore, the shape and distribution of the openings of the cover 120 are more regular and consistent, so the connection port 112b and the second opening 124b aligned to the connection port 112b are less visually prominent. Consequently, the aesthetics of the electronic device 100 becomes more desirable.

The second opening 124a of the embodiment is, for example, a through-hole exposing the connection port 112b. The first openings 122a and the third openings 124b of the embodiment may be through-holes or blind holes. The invention is not limited thereto.

Referring to FIG. 3, in the embodiment, the first covering structure 122 has a greater hardness than the second covering structure 124. Accordingly, when the connector passes through the second opening 124a to elastically deform the cover 120, overall deformation of the cover 120 is controlled by a difference in hardness between the first covering structure 122 and the second covering structure 124 to ensure the deformation is mainly generated at the second covering structure 124. Accordingly, the deformation of the second opening 124a becomes smoother and the first covering structure 122 is prevented from generating unexpected deformation.

In the embodiment, a smallest distance L1 between a peripheral of the second opening 124a and a fringe of the second covering structure 124 along a first direction D1 is, for example, longer than twice of a smallest distance L2 between the peripheral of the second opening 124a and the fringe of the second covering structure 124 along a second direction D2. Accordingly, when the connector passes through the second opening 124a to elastically deform the cover 120, a sequence of deformation of respective portions of the second covering structure 124 may be controlled by the difference between the distance L1 and the distance L2. Specifically speaking, the second covering structure 124 has a smaller size at the distance L2 and may be deformed first due to more significant transmission of power when the second covering structure 124 is exerted a force. By contrast, at the distance L1, the second covering structure 124 has a larger size and may be deformed more slowly due to less significant transmission of power when the second covering structure 124 is exerted a force. In this way, the sequence of deformation of the respective portions of the second covering structure 124 is under control to ensure that the connector is smoothly and substantially inserted into the second opening 124a.

In the embodiment, the second opening 124a is axially symmetrical to a first axis A1, two second axes A2 tilt and are axially symmetrical to the first axis A1, a part of the first openings 122a are arranged along the first axis A1, and another part of the first openings 122a and the third openings 124b are arranged along the two second axes A2. Accordingly, when the connector passes through the second opening 124a to elastically deform the cover 120, the second covering structure 124 is controlled to be deformed along the first axis A1 and the second axes A2 based on directions in which the first openings 122a and the third openings 124b are arranged, ensuring that the second covering structure 124 is deformed along an expected direction.

Figure 4:
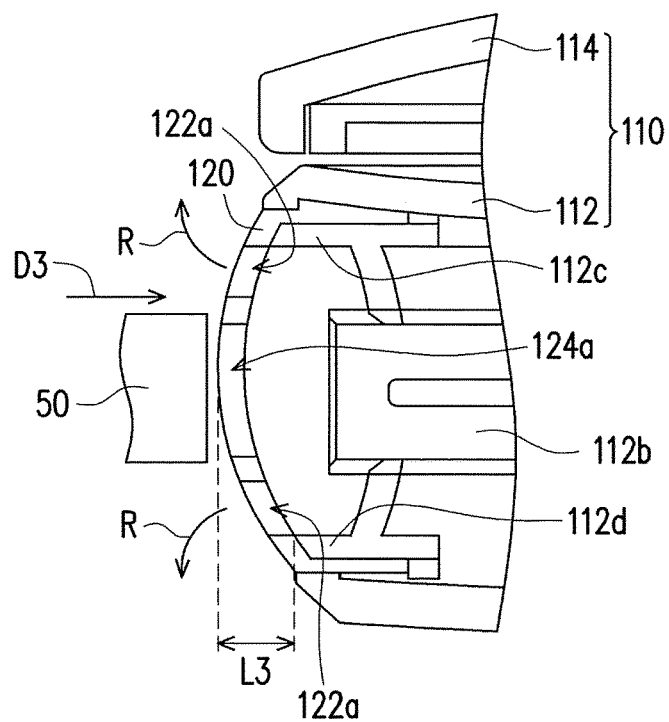
FIG. 4 is a partial cross-sectional view of the electronic device of FIG. 1 along I-I line.

FIG. 4 is a partial cross-sectional view of the electronic device of FIG. 1 along I-I line. At the connection port 112b, the cover 120 of the embodiment has an arc section as illustrated in FIG. 4. An extending distance L3 of the arc section along an insertion direction (a third direction D3 as illustrated in FIG. 4) of the connection port 112b is greater than 2.5 millimeters, for example. Accordingly, when a connector 50 passes through the second opening 124a to elastically deform the cover 120, a sufficient space between the cover 120 and the connection port 112b is provided for deformation of the cover 120, and it is ensured that the cover 120 is deformed along an expected direction (direction R as marked in FIG. 4).

Referring to FIG. 4, in the embodiment, the cover 120 is fixed through fixing structures 112c and 112d of the main frame 112. The fixing structures 112c and 112d are part of a housing of the main frame 112. In other embodiments, the cover 120 may be connected to the main frame 112 through other appropriate ways. The invention is not limited thereto. As illustrated in FIG. 4, the fixing structures 112c and 112d of the embodiment are designed to be vertically asymmetrical, so the fixing structure 112d is disposed more inwardly than the fixing structure 112c. Thus, a structure of a lower half of the cover 120 is disposed more inwardly than a structure of an upper half of the cover 120. Therefore, when being inserted, the connector 50 contacts the structure of the upper half of the cover 120 first and then contacts the structure of the lower half of the cover 120, instead of contacting the structures of the upper half and the lower half of the cover 120 directly at the same time. With the configuration, the connector 50 is subject to smaller resistance at the beginning. In view of the foregoing, the cover according to the embodiments of the invention further has the first openings in addition to the second opening exposing the connection port. Due to distribution of the first openings and the second openings, the appearance of the electronic device is more consistent and continuous to prevent the configuration of the connection port from affecting the appearance of the electronic device. Besides, the second covering structure of the cover corresponding to the second opening may be designed to have a smaller hardness than the first covering structure. In this way, the deformation of the cover is mainly generated at the second covering structure. Accordingly, the second opening is deformed more smoothly and the first covering structure is prevented from generating unexpected deformation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A cover adapted to an electronic device, an outer side of the electronic device having at least one connection port, the cover comprising:
 a first covering structure, disposed on the outer side and having a plurality of first openings, and
 at least one second covering structure, connected to the first covering structure and having a second opening, wherein the second opening is aligned to the at least one connection port, the second opening is separated from the first openings, the second opening is axially symmetrical to a first axis, two second axes tilt and are axially symmetrical to the first axis, a part of the first openings are arranged along the first axis, another part of the first openings are arranged along the two second axes, and a connector is adapted to be inserted into the connection port through the second opening.

2. The cover according to claim 1, wherein a material of the at least one second covering structure comprises an elastic material, and the connector passes through the second opening through elastic deformation of the at least one second covering structure.

3. The cover according to claim 1, wherein the first covering structure and the at least one second covering structure are integrated.

4. The cover according to claim 1, wherein the first covering structure surrounds the second covering structure.

5. The cover according to claim 1, wherein a part of the first openings extend to the second covering structure.

6. The cover according to claim 1, wherein the first covering structure has a greater hardness than the second covering structure.

7. The cover according to claim 1, wherein each of the first openings and the second opening is oval.

8. The cover according to claim 1, wherein a smallest distance between a peripheral of the second opening and a fringe of the second covering structure along a first direction is longer than twice of a smallest distance between the peripheral of the second opening and the fringe of the second covering structure along a second direction.

9. The cover according to claim 1, wherein the cover has an arc section at the connection port, and the arc section extends a distance of greater than 2.5 millimeters in an insertion direction of the connection port.

10. An electronic device, comprising:
 a main body having an outer side, wherein the outer side has at least one connection port; and
 a cover, comprising:
  a first covering structure, disposed on the outer side and having a plurality of first openings; and
  at least one second covering structure, connected to the first covering structure and having a second opening, wherein the second opening is aligned to the at least one connection port, the second opening is separated from the first openings, the second opening is axially symmetrical to a first axis, two second axes tilt and are axially symmetrical to the first axis, a part of the first openings are arranged along the first axis, another part of the first openings are arranged along the two second axes, and a connector is adapted to be inserted to the connection port through the second opening.

11. The electronic device according to claim 10, wherein a material of the at least one second covering structure comprises an elastic material, and the connector passes through the second opening through elastic deformation of the at least one second covering structure.

12. The electronic device according to claim 10, wherein the first covering structure and the at least one second covering structure are integrated.

13. The electronic device according to claim 10, wherein the first covering structure surrounds the second covering structure.

14. The electronic device according to claim 10, wherein a part of the first openings extend to the second covering structure.

15. The electronic device according to claim 10, wherein the first covering structure has a greater hardness than the second covering structure.

16. The electronic device according to claim 10, wherein each of the first openings and the second opening is oval.

17. The electronic device according to claim 10, wherein a smallest distance between a peripheral of the second opening and a fringe of the second covering structure along a first direction is longer than twice of a smallest distance between the peripheral of the second opening and the fringe of the second covering structure along a second direction.

18. The electronic device according to claim 10, wherein the cover has an arc section at the connection port, and the arc section extends a distance of greater than 2.5 millimeters along an insertion direction of the connection port.

* * * * *